United States Patent
Nakaya

(10) Patent No.: US 9,555,717 B2
(45) Date of Patent: Jan. 31, 2017

(54) STORAGE BATTERY TRANSFER SUPPORT DEVICE AND STORAGE BATTERY TRANSFER SUPPORT METHOD

(71) Applicant: Panasonic Corporation, Osaka (JP)

(72) Inventor: Satoshi Nakaya, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 271 days.

(21) Appl. No.: 14/363,359

(22) PCT Filed: Dec. 4, 2012

(86) PCT No.: PCT/JP2012/007776
§ 371 (c)(1),
(2) Date: Jun. 6, 2014

(87) PCT Pub. No.: WO2013/084481
PCT Pub. Date: Jun. 13, 2013

(65) Prior Publication Data
US 2014/0320144 A1 Oct. 30, 2014

(30) Foreign Application Priority Data
Dec. 6, 2011 (JP) .................................. 2011-266774

(51) Int. Cl.
*H01M 10/46* (2006.01)
*B60L 11/18* (2006.01)
(Continued)

(52) U.S. Cl.
CPC ........ *B60L 11/1851* (2013.01); *B60L 11/1861* (2013.01); *G06Q 10/06315* (2013.01);
(Continued)

(58) Field of Classification Search
CPC .. H02J 7/0003; H02J 7/0011; H02J 2007/005; H02J 7/0021
(Continued)

(56) References Cited

U.S. PATENT DOCUMENTS

| 8,373,419 B2 | 2/2013 | Ugaji et al. |
| 2008/0281732 A1 | 11/2008 | Yamada |

(Continued)

FOREIGN PATENT DOCUMENTS

| CN | 101071953 A | 11/2007 |
| CN | 101772709 A | 7/2010 |

(Continued)

OTHER PUBLICATIONS

Extended European Search Report for Application No. 12856271.7 dated Jul. 22, 2015.
(Continued)

*Primary Examiner* — Edward Tso
(74) *Attorney, Agent, or Firm* — Pearne & Gordon LLP

(57) ABSTRACT

The present invention serves to reduce the costs associated with the overall life cycle of storage batteries by performing support so that a plurality of batteries are transferred between and used at a plurality of facilities. This storage battery transfer support device comprises: a collection unit that collects battery information representing the status of each battery used at a plurality of facilities; a battery information storage unit that stores the battery information collected by the collection unit; and a deterioration prediction unit that, on the basis of the battery information stored in the battery information storage unit, predicts deterioration of storage batteries that have been transferred between and used at a plurality of facilities.

20 Claims, 16 Drawing Sheets

(51) Int. Cl.
  *H01M 10/54* (2006.01)
  *H01M 10/48* (2006.01)
  *G06Q 10/06* (2012.01)
  *G06Q 50/06* (2012.01)
  *H01M 10/42* (2006.01)

(52) U.S. Cl.
  CPC .......... *G06Q 50/06* (2013.01); *H01M 10/482* (2013.01); *H01M 10/54* (2013.01); *B60L 2240/54* (2013.01); *B60L 2240/72* (2013.01); *B60L 2240/80* (2013.01); *B60L 2260/50* (2013.01); *H01M 2010/4278* (2013.01); *H01M 2220/20* (2013.01); *Y02T 10/7005* (2013.01); *Y02T 10/7044* (2013.01); *Y02T 10/7291* (2013.01); *Y02T 90/163* (2013.01); *Y02W 30/84* (2015.05)

(58) Field of Classification Search
  USPC .. 320/106, 107, 109, 110, 116, 132; 702/62, 702/63; 340/635
  See application file for complete search history.

(56) References Cited

U.S. PATENT DOCUMENTS

| | | | |
|---|---|---|---|
| 2010/0188039 A1* | 7/2010 | Yamauchi | H01M 10/42 320/106 |
| 2010/0264929 A1 | 10/2010 | Ugaji et al. | |
| 2013/0018610 A1* | 1/2013 | Yamauchi | H01M 10/42 320/106 |

FOREIGN PATENT DOCUMENTS

| | | |
|---|---|---|
| EP | 1 786 057 A2 | 5/2007 |
| EP | 2 386 754 A1 | 11/2011 |
| JP | 2002-140398 A | 5/2002 |
| JP | 2008-268082 A | 11/2008 |
| JP | 2011-154693 A | 8/2011 |

OTHER PUBLICATIONS

Peter Wolfs: "An economic assessment of second use lithium-ion batteries for grid support", Universities Power Engineering Conference, 2010 20th Australasian, Dec. 5, 2010, pp. 1-6, XP031913102.

Vilayanur V Viswanathan et al: "Second Use of Transportation Batteries: Maximizing the Value of Batteries for Transportation and Grid Services", IEEE Transations on Vehicular Technology, IEEE Service Center, Piscataway, NJ, US, vol. 60, No. 7, Sep. 1, 2011, pp. 2963-2970, XP011359733.

Marano V et al: "Lithium-ion batteries life estimation for plug-in hybrid electric vehicles", Vehicle Power and Propulsion Conference, 2009. VPPC '09. IEEE, IEEE, Piscataway, NJ, US, Sep. 7, 2009, pp. 536-543, XP031637819.

English translation of Chinese Search Report for Chinese Application No. 201280059039.X dated Nov. 18, 2015.

International Search Report for Application No. PCT/JP2012/007776 dated Jan. 8, 2013.

* cited by examiner

| STORAGE BATTERY NUMBER | MODEL NUMBER | PRESENT USE PLACE | HISTORY OF PAST USE PLACES | IN-USE BATTERY INFORMATION ||||||||
|---|---|---|---|---|---|---|---|---|---|---|
| | | | | INITIAL CAPACITY | VOLTAGE LOG | CURRENT LOG | TEMPERATURE LOG | SOC | SOH | SOP |
| 1 | N1 | VEHICLE A | N/A | Q1 | $V1(t_i)$ | $I1(t_i)$ | $T1(t_i)$ | $SOC1(t_i)$ | $SOH1(t_i)$ | $SOP1(t_i)$ |
| 2 | N2 | HOUSE A | VEHICLE | Q2 | $V2(t_i)$ | $I2(t_i)$ | $T2(t_i)$ | $SOC2(t_i)$ | $SOH2(t_i)$ | $SOP2(t_i)$ |
| 3 | N3 | BUILDING A | VEHICLE → HOUSE | Q3 | $V3(t_i)$ | $I3(t_i)$ | $T3(t_i)$ | $SOC3(t_i)$ | $SOH3(t_i)$ | $SOP3(t_i)$ |
| .... | .... | .... | .... | .... | .... | .... | .... | .... | .... | .... |

FIG. 2

| DETERIORATION PREDICTION INFORMATION | | |
|---|---|---|
| STORAGE BATTERY NUMBER | RELOCATION MODEL | SOH CURVILINEAR DATA |
| 1 | MODEL 1a | CURVE 1a |
| | MODEL 1b | CURVE 1b |
| | MODEL 1c | CURVE 1c |
| | ⋮ | ⋮ |
| 2 | MODEL 2a | CURVE 2a |
| | MODEL 2b | CURVE 2b |
| | MODEL 2c | CURVE 2c |
| | ⋮ | ⋮ |
| 3 | MODEL 3a | CURVE 3a |
| | MODEL 3b | CURVE 3b |
| | MODEL 3c | CURVE 3c |
| | ⋮ | ⋮ |
| ⋮ | ⋮ | ⋮ |

FIG. 3

| USE DESTINATION | USE-DESTINATION-INFORMATION | | | | |
|---|---|---|---|---|---|
| | CONTRACTOR | USE DESTINATION CATEGORY | CONTRACT ELECTRIC POWER DEMAND | CONTRACT BATTERY CAPACITY | INSTALLATION SPACE |
| HOUSE A | K1 | S1 | W1 | Q1 | Z1 |
| BUILDING A | K2 | S2 | W2 | Q2 | Z2 |
| VEHICLE A | K3 | S3 | W3 | Q3 | Z3 |
| FACTORY A | K4 | S4 | W4 | Q4 | Z4 |
| . . . . | . . . . | . . . . | . . . . | . . . . | . . . . |

FIG. 4

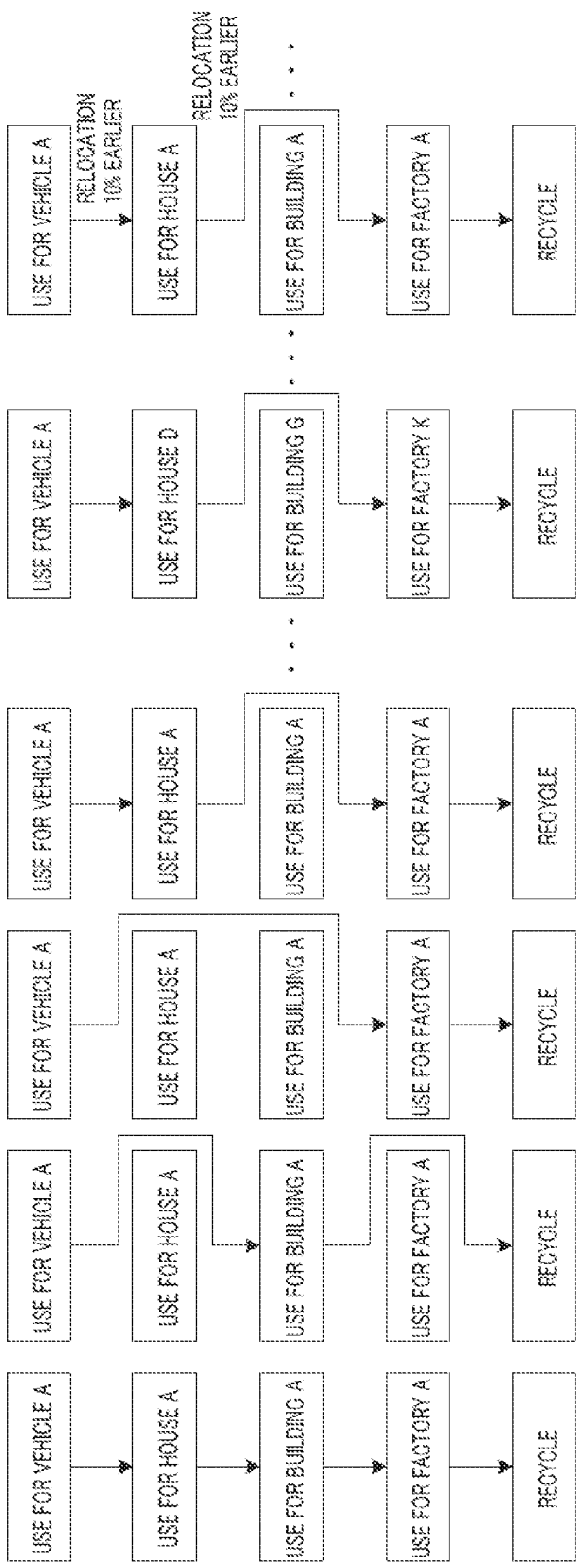

| DETERMINATION REQUIREMENTS FOR RELOCATION | WEIGHTING |
|---|---|
| MAINTAIN CONTRACT ELECTRIC POWER DEMAND IN EACH USE DESTINATION | $\lambda 1$ |
| MAINTAIN CONTRACT BATTERY CAPACITY IN EACH USE DESTINATION | $\lambda 2$ |
| SET RELOCATION TIME IN A WAY THAT MAKES RELOCATION TIME CLOSE TO TIME WHEN STORAGE BATTERY COMES NEAR LOWER LIMIT OF REQUIRED PERFORMANCE | $\lambda 3$ |
| DECREASE NUMBER OF NEW STORAGE BATTERIES TO BE SUPPLIED | $\lambda 4$ |
| REDUCE VARIATION IN DETERIORATION DEGREES OF STORAGE BATTERIES USED SIMULTANEOUSLY | $\lambda 5$ |
| DECREASE RESERVED QUANTITY OF COLLECTED BATTERIES | $\lambda 6$ |
| ... | ... |

FIG. 13

STORAGE BATTERY TRANSFER SUPPORT DEVICE AND STORAGE BATTERY TRANSFER SUPPORT METHOD

TECHNICAL FIELD

The present invention relates to a storage battery relocation assistance apparatus for providing the assistance for relocating and using a storage battery and also to a storage battery relocation assistance method for the same.

BACKGROUND ART

In recent years, a large number of electric vehicles running with electric power from storage batteries, such as HEVs (Hybrid Electric Vehicles), PEVs (Plug-in Electric Vehicles), and EVs (Electric Vehicles), have been utilized. Examples of the storage batteries mentioned herein include a lithium ion secondary battery and a nickel hydrogen secondary battery.

Electricity storage systems for supplementing electric power supply using storage batteries have been put in practical use at, for example, houses, buildings, or factories. In such electricity storage systems, storage batteries are charged with surplus generated electric power or low cost midnight electric power, while the storage batteries are used to supply electric power to electric appliances when the amount of electric power generation decreases, or during a time period when the cost of a commercial power source is high, or when electric power is in shortage.

Moreover, as an example of the related art of the present invention, Patent Literature 1 discloses a power supply service system that manages the use state of the battery of a car and the customers and enables smooth charging and replacing of the battery.

CITATION LIST

Patent Literature

PTL 1
Japanese Patent Application Laid-Open No. 2002-140398

SUMMARY OF INVENTION

Technical Problem

A storage battery used to run a vehicle is subject to very severe conditions, such as repetitive charging and outputting of a high current. In comparison with the use conditions, the use conditions of a storage battery in an electricity storage system in a house, for example, are moderate.

Conventionally, a storage battery used in a vehicle can be technically recycled when deteriorating and no longer satisfying use conditions. More specifically, the storage battery includes rare materials, so that deteriorated storage battery undergoes a decomposing process and is then utilized as new storage battery materials.

However, since a storage battery in a vehicle is subject to very severe condition, even a storage battery unusable in a vehicle often exerts sufficient performance when used in other facilities. Moreover, recycling of a storage battery requires a relatively high cost. For this reason, there arises a problem in that recycling of a storage battery usable for other facilities increases a comprehensive cost for a life cycle from manufacturing to recycling of a storage battery.

It is an object of the present invention to provide a storage battery relocation assistance apparatus that can provide the assistance for relocating and using a plurality of storage batteries among a plurality of facilities to contribute to a comprehensive cost reduction for life cycles of the storage batteries and also to provide a storage battery relocation assistance apparatus method that can provide the same.

Solution to Problem

A storage battery relocation assistance apparatus according to an aspect of the present invention includes: a collection section that collects battery information representing a state of a plurality of storage batteries used in a plurality of facilities; a battery information storing section that stores the battery information collected by the collection section; and a deterioration prediction section that predicts deterioration of the plurality of storage batteries when the plurality of storage batteries are relocated and used among the plurality of facilities, based on the battery information stored in the battery information storing section.

A storage battery relocation assistance method according to an aspect of the present invention includes: collecting battery information representing a state of a plurality of storage batteries used in a plurality of facilities, through a communication network or a storage medium; storing, in a battery information storing section, the battery information collected by the collecting; and predicting, by a deterioration prediction section, deterioration of the plurality of storage batteries when the plurality of storage batteries are relocated and used among the plurality of facilities, based on the battery information stored in the battery information storing section.

Advantageous Effects of Invention

According to the present invention, deterioration of a plurality of storage batteries relocated and used among a plurality of facilities is predicted, and thus determining the optimal relocation time and relocation destination of the storage battery can be assisted based on the result of prediction of deterioration. Accordingly, it is possible to make a contribution to a comprehensive cost reduction for the life cycle of a storage battery.

BRIEF DESCRIPTION OF DRAWINGS

FIG. 2 is a data table illustrating an example of in-use battery information stored in an in-use battery information storing section;

FIG. 3 is a data table illustrating an example of deterioration prediction information stored in an in-use battery deterioration prediction information storing section;

FIG. 4 is a data table illustrating an example of use-destination-information stored in a use-destination-information storing section;

FIGS. 9A to 9D, 9M and 9Q are diagrams for describing various relocation models of the storage batteries;

FIG. 13 is a table illustrating example determination requirements for relocating a storage battery;

DESCRIPTION OF EMBODIMENTS

Hereinafter, embodiments according to the present invention will be described in detail with reference to the accompanying drawings.

Figure 1:
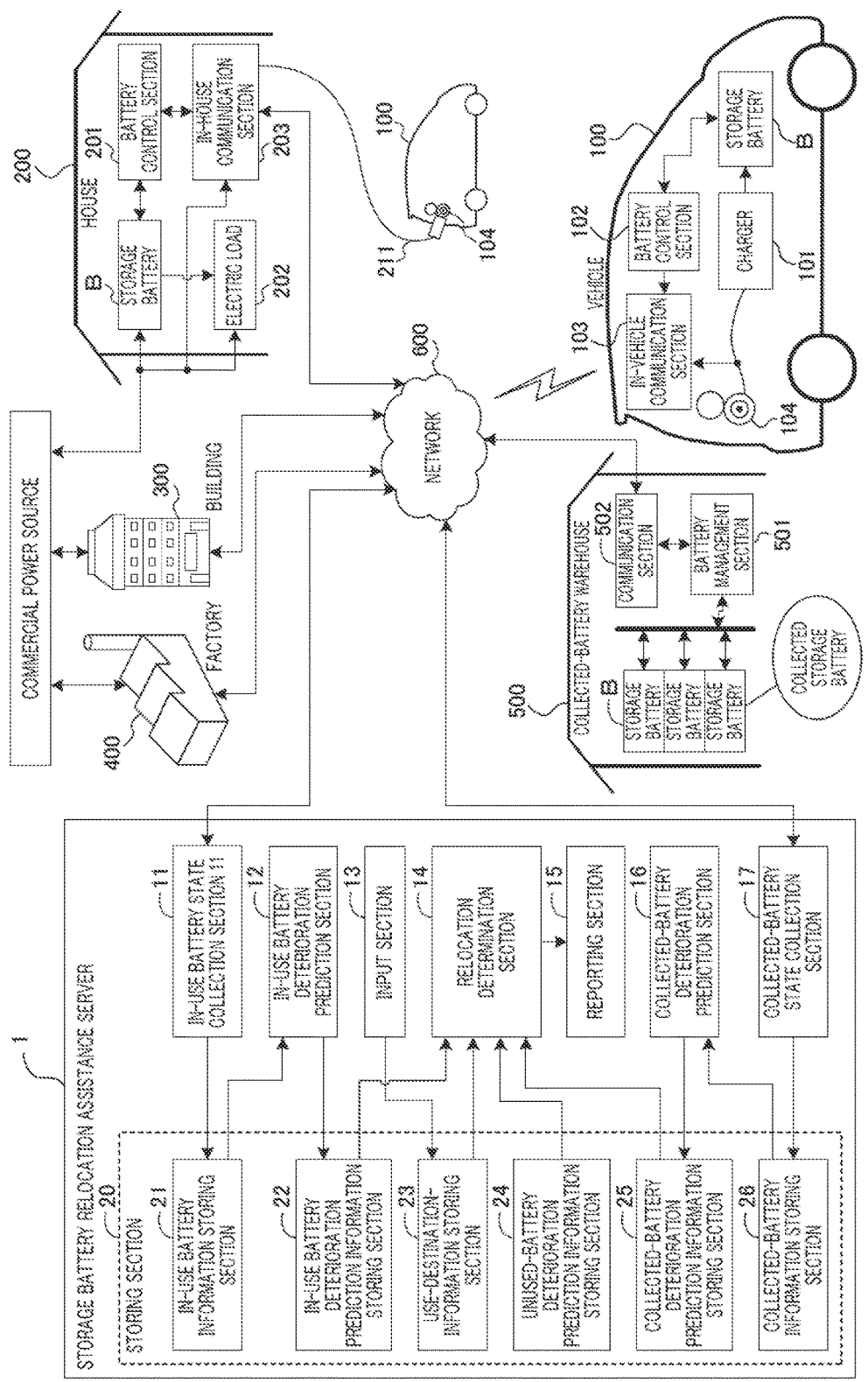
FIG. 1 is a configuration diagram illustrating a whole storage battery recycle system.

FIG. 1 is a configuration diagram illustrating a whole storage battery recycle system according to an embodiment of the present invention.

The storage battery recycle system in this embodiment includes storage battery relocation assistance server 1, a plurality of vehicles 100, a plurality of houses 200, a plurality of buildings 300, a plurality of factories 400, collected-battery warehouse 500, and network 600 utilized for data transmission. In FIG. 1, one each of the plurality of vehicles 100, houses 200, buildings 300 and factories 400 is illustrated by one representative element.

In these configurations, storage battery relocation assistance server 1 corresponds to an embodiment of the storage battery relocation assistance apparatus according to the present invention, and vehicle 100, house 200, building 300, and factory 400 correspond to an embodiment of a plurality of facilities using a storage battery.

[Configuration of Storage Battery Relocation Assistance Server]

Storage battery relocation assistance server 1 is a computer including, for example, a CPU (Central Processing Unit) as an arithmetic unit, a RAM (Random Access Memory) and a hard disk as storing section 20, a communication apparatus, a display or a printer as an information output section, and an input apparatus for inputting an operational command from an operator.

In storage battery relocation assistance server 1, a software module read from the hard disk is expanded on the RAM and is executed by the CPU to implement a plurality of functional modules. More specifically, storage battery relocation assistance server 1 includes, as the plurality of functional modules, in-use battery state collection section 11, in-use battery deterioration prediction section 12, input section 13 for inputting information on use destinations, relocation determination section 14, reporting section 15, collected-battery deterioration prediction section 16, and collected-battery state collection section 17.

Storing section 20 in storage battery relocation assistance server 1 includes in-use battery information storing section 21, in-use battery deterioration prediction information storing section 22, use-destination-information storing section 23, unused-battery deterioration prediction information storing section 24, collected-battery deterioration prediction information storing section 25, and collected-battery information storing section 26.

This plurality of storing sections 21 to 26 stores and manages predetermined information according to predetermined formats. In-use battery information storing section 21 corresponds to an embodiment of the battery information management section according to the present invention, and use-destination-information storing section 23 corresponds to an embodiment of the requirement information management section according to the present invention.

In-use battery state collection section 11 collects information (referred to as battery information) representing a state of a plurality of storage batteries used in the plurality of vehicles 100, the plurality of houses 200, the plurality of buildings 300, and the plurality of factories 400, and stores the information in in-use battery information storing section 21. The battery information is collected always or periodically. In-use battery state collection section 11 is capable of exchanging data with the communication sections of the plurality of vehicles 100, the plurality of houses 200, the plurality of buildings 300, and the plurality of factories 400 through a communication apparatus connected to network 600. The collected in-use battery information will be described below in detail.

In-use battery deterioration prediction section 12 predicts future deterioration of each storage battery on the basis of the battery information on an in-use storage battery, and stores this prediction result (referred to as deterioration prediction information) in in-use battery deterioration prediction information storing section 22. This deterioration prediction information will be described below in detail.

Input section 13 receives information, which is inputted by an operator according to a predetermined input format through the input apparatus, on each facility (referred to as use-destination-information) of the plurality of vehicles 100, the plurality of houses 200, the plurality of buildings 300, and the plurality of factories 400. Input section 13 then stores the inputted use-destination-information in use-destination-information storing section 23. The content of this use-destination-information will be described below.

Collected-battery state collection section 17 collects information representing a state of a plurality of storage batteries kept in collected-battery warehouse 500, and stores the information in collected-battery information storing section 26. Collected-battery state collection section 17 is capable of exchanging data with a communication section of collected-battery warehouse 500 through a communication apparatus connected to network 600. The collected information in this case is almost the same as information collected by in-use battery state collection section 11.

Collected-battery deterioration prediction section 16 predicts future deterioration of the plurality of storage batteries kept in collected-battery warehouse 500, and stores information on the prediction result in collected-battery deterioration prediction information storing section 25. The details of this deterioration prediction will be described later as a supplement for prediction of deterioration of an in-use storage battery.

Unused-battery deterioration prediction information storing section 24 is a storing section for beforehand storing, as deterioration prediction information, information on the future deterioration property of an unused storage battery that is kept while being unused.

Relocation determination section 14 reads, from storing section 20, the deterioration prediction information on an in-use storage battery, the deterioration prediction information on an unused storage battery, the deterioration prediction information on a collected storage battery, and the use-destination-information on each facility. Based on the above-described deterioration prediction information and information on predetermined relocation requirements for a storage battery, relocation determination section 14 then performs an optimization process and determines the optimal relocation time and relocation destination of each storage battery. That is, relocation determination section 14 determines the optimal relocation schedule for each storage battery.

Reporting section 15 extracts, for example, a relocation schedule involving relocation time close to the present time from among the optimal relocation schedules for respective storage batteries determined in relocation determination section 14, and lists these information items on the display or on a printout. Based on these information items, an operator sets the schedule for relocation exchange for storage batteries in the plurality of vehicle 100, the plurality of house 200, the plurality of building 300, the plurality of factory 400, and collected-battery warehouse 500, and advances a procedure of relocation of the storage batteries. That is, the operator and a worker, for example, report to a contractor, an exchange of a storage battery, and then perform exchange maintenance of a storage battery on the basis of the schedule for a relocation exchange.

[Configuration of Facility Using or Keeping Storage Battery]

Vehicle 100 includes storage battery B, charger 101, battery control section 102, in-vehicle communication section 103, and socket 104. Storage battery B supplies electric power to a running motor (not illustrated) of vehicle 100 to drive the vehicle. Socket 104 is connected to external cable 211 for the input of an external power source and transmission and reception of data. Charger 101 charges storage battery B with the external power source inputted from socket 104.

Battery control section 102 controls necessary electric power supplied to the running motor from storage battery B. Battery control section 102 measures and monitors, for example, the voltage, input and output currents, a temperature, a state of charge (SOC), and a deterioration state (SOH: State Of Health) of storage battery B, and transmits these information items to storage battery relocation assistance server 1 through in-vehicle communication section 103. If cable 211 serving as a communication path is connected to socket 104, in-vehicle communication section 103 performs data communication through cable 211. Otherwise, in-vehicle communication section 103 is connected to network 600 through radio communication and performs data communication.

Here, the state of charge (SOC) is the ratio of a residual capacity to a fully charged capacity, and the deterioration state (SOH: State Of Health) is a value representing a state of deterioration of a storage battery calculated from the internal resistance value of the storage battery.

House 200 includes, for example, storage battery B, battery control section 201, electric load 202, and in-house communication section 203. For example, storage battery B is charged with electric power from a commercial power source (also referred to as a common power source) in the time zone when an electricity price is low, and supplies electric power to electric load 202 in the time zone when the electricity price is high or when electricity is deficient.

Electric load 202 is one of various kinds of electric appliances used in house 200. Battery control section 201 measures and monitors, for example, the voltage, input and output currents, a temperature, a state of charge (SOC), and a state of health (SOH) of storage battery B, and transmits these information items to storage battery relocation assistance server 1 through in-house communication section 203. In-house communication section 203 can be connected to network 600 to perform data communication.

Each of building 300 and factory 400 also includes storage battery B, a battery control section, an electric load, and a communication section similarly to house 200.

When relocation use (also referred to as reuse) of storage batteries B is performed between the facilities which are vehicle 100, house 200, building 300, and factory 400, collected-battery warehouse 500 is a facility for keeping storage batteries B temporarily collected from any of the facilities.

Collected-battery warehouse 500 includes collected storage battery B, battery management section 501, and communication section 502.

Battery management section 501 controls storage battery B so as to be maintained in an appropriate state of charge, or control storage battery B so as to appropriately charge and discharge, in order to delay the progression degree of deterioration of storage battery B. Battery control section 501 measures the voltage, input and output currents, a temperature, a state of charge (SOC), and a state of health (SOH) of storage battery B, and transmits the measurement result to storage battery relocation assistance server 1 through communication section 502.

[In-Use Battery Information]

FIG. 2 is a data table illustrating an example content of the in-use battery information stored in in-use battery information storing section 21.

In-use battery information storing section 21 stores a plurality of respective information items representing states of a plurality of storage batteries used in the plurality of facilities. To these information items, the information collected by in-use battery state collection section 11 is sequentially added.

The in-use battery information stored in in-use battery information storing section 21 includes, for example, a model number, a present use place, the history of past use places, an initial capacity, a voltage log, a current log, a temperature log, a state of charge (SOC), a state of health (SOH), and charge/discharge allowable electric power (also referred to as an SOP: State Of Power (prediction electric power ability)). These information items are independently stored for all the registered storage batteries. Information on the voltage log, the current log, and the temperature log is stored as the series of data representing the voltage, current, and a temperature at a plurality of time points (ti), respectively. Information on the state of charge, the state of health, and charge/discharge allowable electric power is also stored as the series of data representing the respective values at a plurality of time points.

Here, the charge/discharge allowable electric power (SOP) represents the maximum charge electric power and the maximum electric discharge electric power estimated from, for example, the voltage and the internal resistance of the storage battery.

In-use battery state collection section 11 collects, from each facility, respective information items on the voltage log, the current log, the temperature log, the state of charge (SOC), the deterioration state (SOH), and the charge/discharge allowable electric power (SOP) among the items in the data table of FIG. 2. In-use battery state collection section 11 then adds the collected information items to the in-use battery information items and stores the resultant information items.

Collected-battery information storing section 26 also stores respective collected-battery information items including the items in the data table of FIG. 2. Collected-battery state collection section 17 collects, from collected-battery warehouse 500, respective information items on the voltage log, the current log, the temperature log, the state of charge (SOC), the deterioration state (SOH), and the charge/discharge allowable electric power (SOP). Collected-battery state collection section 17 then adds the collected information items to the collected-battery information items and stores the resultant information items in collected-battery information storing section 26.

[Deterioration Prediction Information]

FIG. 3 is a data table illustrating an example of the deterioration prediction information stored in in-use battery deterioration prediction information storing section 22.

As illustrated in FIG. 3, in-use battery deterioration prediction information storing section 22 stores a plurality of pieces of curvilinear data of deterioration states predicted according to various relocation models for each storage battery.

The relocation model is a model representing at which time and to which facility a target storage battery is relocated. The relocation model will be described below in detail. As illustrated in FIGS. 9A to 9D, 9M and 9Q, various relocation models are set so as to include various relocation patterns possible for relocation of storage batteries in reality.

The curvilinear data of deterioration states will be described below in detail. As illustrated in FIG. 10, the curvilinear data is data representing a time variation in a deterioration state (referred to as SOH or "the residual capacity of a battery").

[Use-Destination-Information]

FIG. 4 is a data table illustrating an example of the use-destination-information stored in use-destination-information storing section 23.

The use-destination-information includes, as information representing each facility, use destination data for identifying the facility, contractor data for identifying a contractor, and use destination category data for representing the category (for example, a vehicle, a house, a building, and a factory) of the facility, for example. The use-destination-information includes, as requirement information to the storage battery, information on contract electric power demand representing the maximum electric power which can be supplied from the storage battery, information on a contract battery capacity representing the minimum capacity of the storage battery, and information on an installation space for installing the storage battery, for example.

Use-destination-information storing section 23 stores the above-described use-destination-information for all facilities receiving service of the supply of the storage batteries.

When a contractor is added, information representing the facility of the contractor is inputted from input section 13, and use-destination-information concerning the new contractor is added to use-destination-information storing section 23.

[Relationship between Relocation Use and Deterioration Curve]

Here, the action and the advantageous effects of the relocated and used storage battery will be explained.

Figure 5:
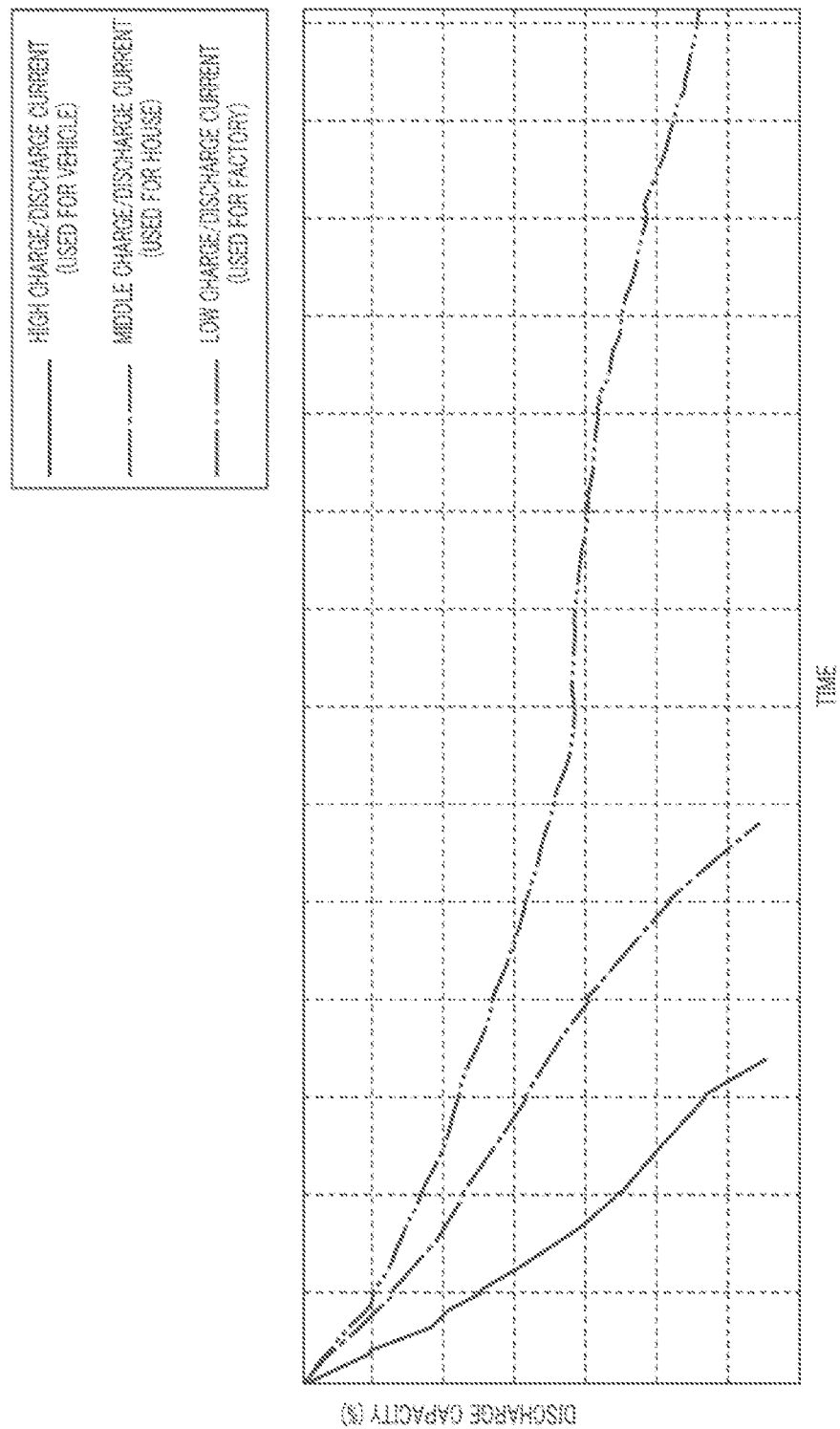
FIG. 5 is a graph illustrating a time variation in the discharge capacity of the same storage battery charged and discharged repeatedly with a predetermined current amount.

FIG. 5 is a graph illustrating a time variation in the discharge capacity of the same storage battery charged and discharged repeatedly with a predetermined current amount. Respective three graph lines in FIG. 5 indicate the cases of high, middle, and low charge/discharge currents.

As illustrated in the graph of FIG. 5, the storage battery deteriorates and gradually decreases the discharge capacity (also referred to as a battery capacity) by repeating charge and discharge. The magnitude of a charge/discharge current for the storage battery, i.e., the severity of use of the storage battery also varies the rate of deteriorating the storage battery. For example, a higher charge/discharge current increases the rate of the deterioration, and a lower charge/discharge current decreases the rate of the deterioration.

The graph line for the high charge/discharge current in FIG. 5 indicates an example case used for a vehicle. Storage battery B of vehicle 100 outputs a large current in the case of running, and rapidly charges in the case of charging. Therefore, the use conditions for the storage battery in vehicle 100 are very severe in comparison with the other facilities. Moreover, since vehicle 100 is required to have a high storage battery performance, the storage battery performance reaches the lower limit of the required performance of vehicle 100 at a stage at which the deterioration degree of the storage battery does not progress so much.

The graph line for the middle charge/discharge current in FIG. 5 indicates an example case used for a house. Storage battery B in house 200 or building 300 charges and discharges relatively moderately. Furthermore, in house 200 or building 300, the installation space for storage battery B is large in comparison with vehicle 100, and many storage batteries can be used in parallel. Therefore, in house 200 or building 300, the use conditions required for storage battery B are moderate in comparison with vehicle 100. Moreover, since the use conditions are moderate, the storage battery performance required for house 200 or building 300 is low in comparison with that for vehicle 100.

The graph line for the low charge/discharge current in FIG. 5 indicates an example case used for a factory. In factory 400, storage battery B charges and discharges in a further planned and stable manner. Moreover, in factory 400, the installation space for storage battery B is further large in comparison with house 200 and building 300, and an enormous number of storage batteries can be used in parallel. Therefore, the use conditions for storage battery B in factory 400 are moderate in comparison with the use conditions for house 200 and building 300. Moreover, since the use conditions are moderate, the storage battery performance required for factory 400 is low in comparison with those for house 200 and building 300.

Therefore, as illustrated in FIG. 5 in many cases, the progression degree of deterioration is large in the storage battery used in vehicle 100, and decreases in the storage batteries used in house 200 (or building 300) and factory 400 in this order.

Even if vehicles 100 are of the same type, respective vehicles 100 involve different progression degrees of deterioration since, for example, users use vehicles 100 at different frequencies. In the other facilities, the progression degrees of deterioration also differ in the respective facilities similarly.

Figure 6A:
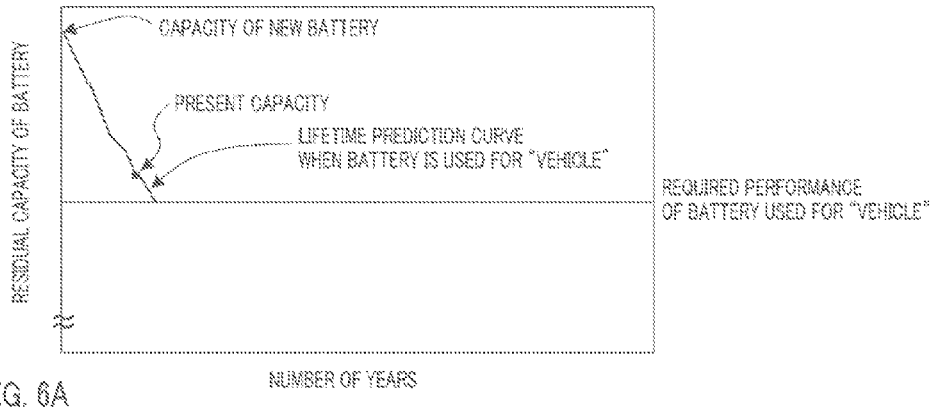
FIGS. 6A to 6C are graphs illustrating changes in deterioration curves in the case of relocation use of the storage battery.
Figure 6B:
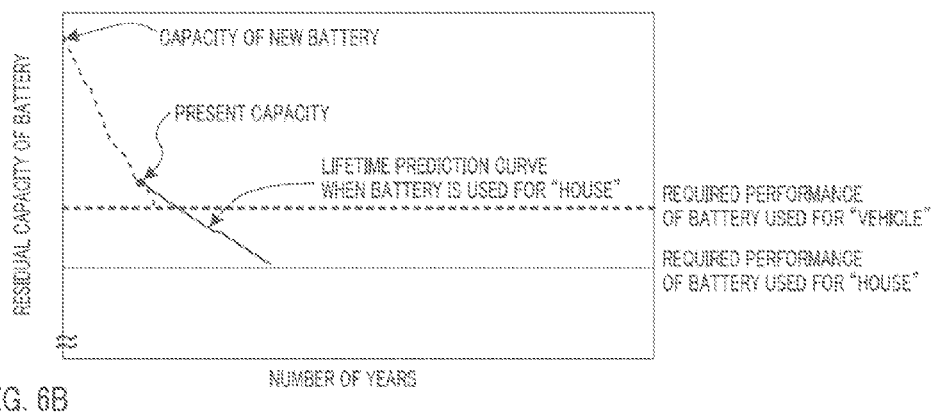
Figure 6C:
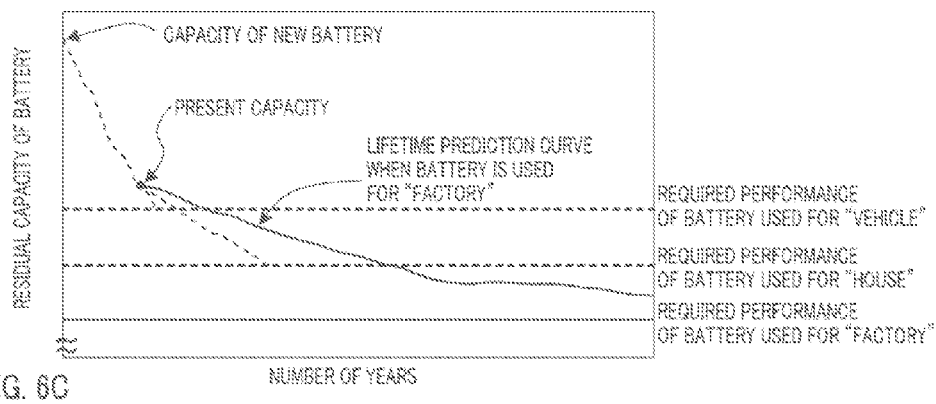

Moreover, as illustrated in FIGS. 6A to 6C, the storage battery performance required for each application is the highest in vehicle 100, and decreases in the order of house 200 (or building 300) and factory 400.

FIGS. 6A to 6C are graphs illustrating changes in deterioration curves in the case of relocation use of the storage battery. FIGS. 6A to 6C illustrate deterioration curves of storage batteries when a storage battery used for a certain period in a vehicle continues being used in the vehicle and when the storage battery used for the certain period is relocated to and used in a house or a factory, as an example.

As illustrated in FIGS. 6A to 6C, the deterioration curve of a storage battery variously changes depending on to which facility the storage battery is relocated for use and depending on when the storage battery is relocated. Moreover, assuming that the time point of the storage battery performance reaching the lower limit of the performance required for each facility is defined as a storage battery life, as can be seen from comparison in FIGS. 6A to 6C, the relocation use of a storage battery can lead to a longer storage battery life of the storage battery.

[Configuration of Storage Battery]

Figure 7:
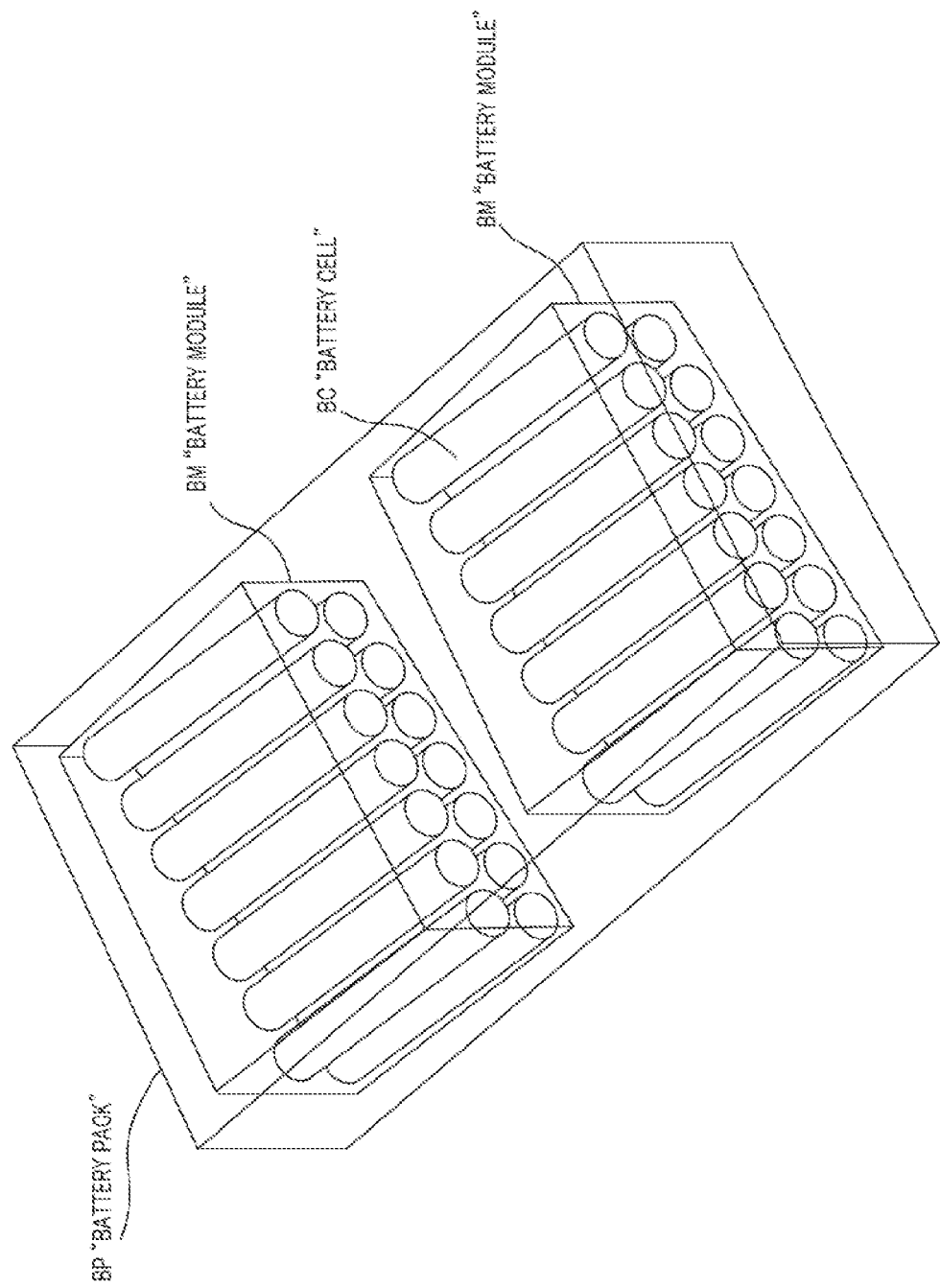
FIG. 7 illustrates an example configuration of a storage battery pack.

FIG. 7 is a configuration diagram illustrating the details of storage battery B.

Storage battery B as an object to be provided in a system of the present embodiment is composed of, for example, a lithium ion secondary battery. Storage battery B is provided by being packaged in a form of battery pack BP which can readily be mounted on each facility. Moreover, battery pack BP includes a plurality of battery modules BM bundled in order to provide predetermined output and capacity. Moreover, each battery module BM has a plurality of battery cells BC mounted therein.

The collection and management of the battery information and the relocation use of the storage battery described above can be performed in units of battery packs BP, and also in units of battery modules BM or in units of battery cells BC.

[Deterioration Prediction Process on Storage Battery]

Next, a storage battery deterioration prediction process performed by in-use battery deterioration prediction section 12 will be explained.

Figure 8:
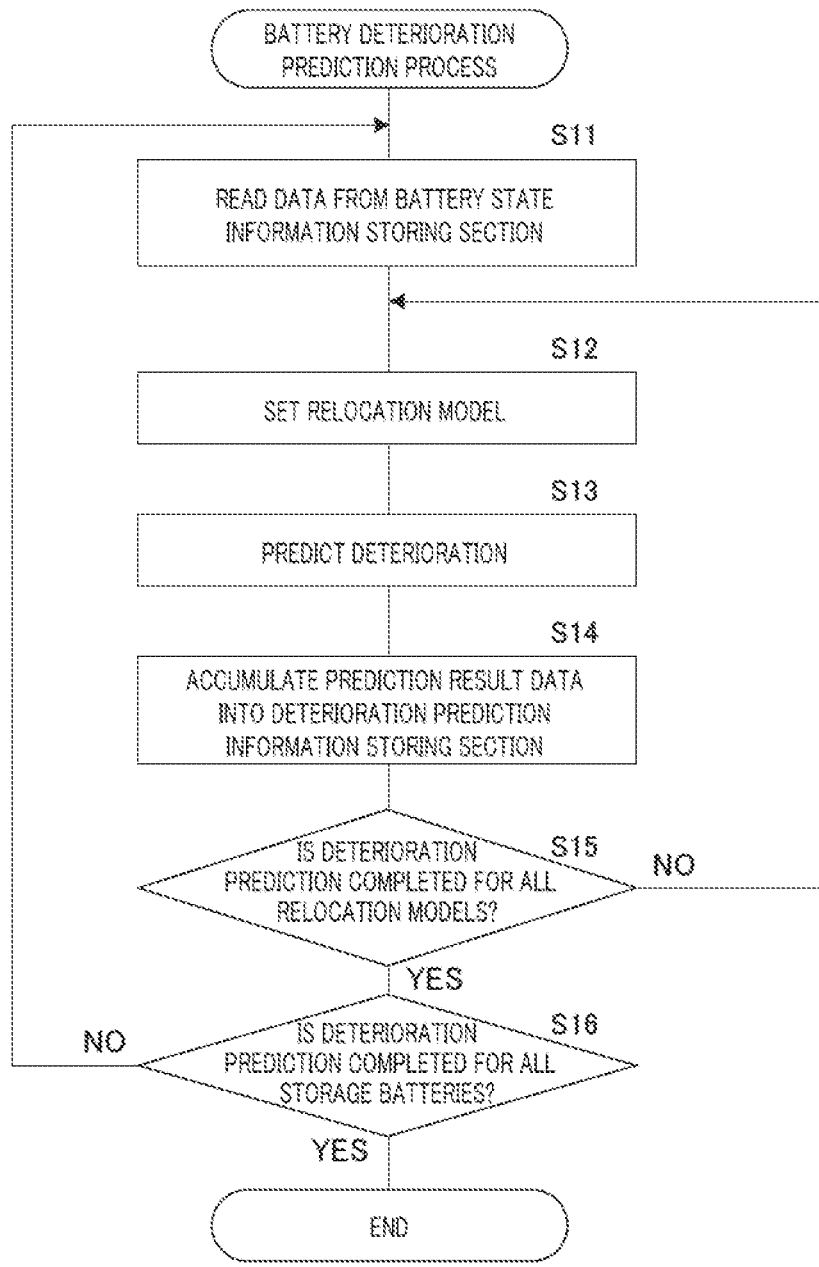
FIG. 8 is a flow chart of a storage battery deterioration prediction process performed in an in-use battery deterioration prediction section.
Figure 10A:
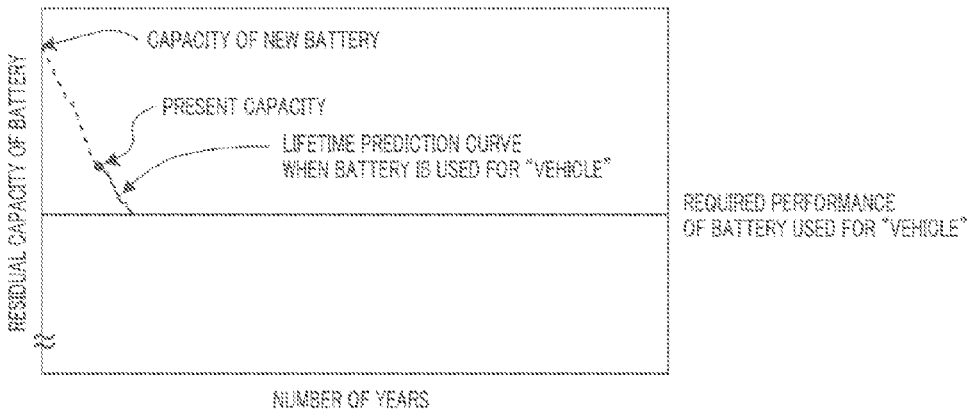
FIGS. 10A to 10C are graphs illustrating the deterioration prediction curves of the storage battery in one relocation model.
Figure 10B:
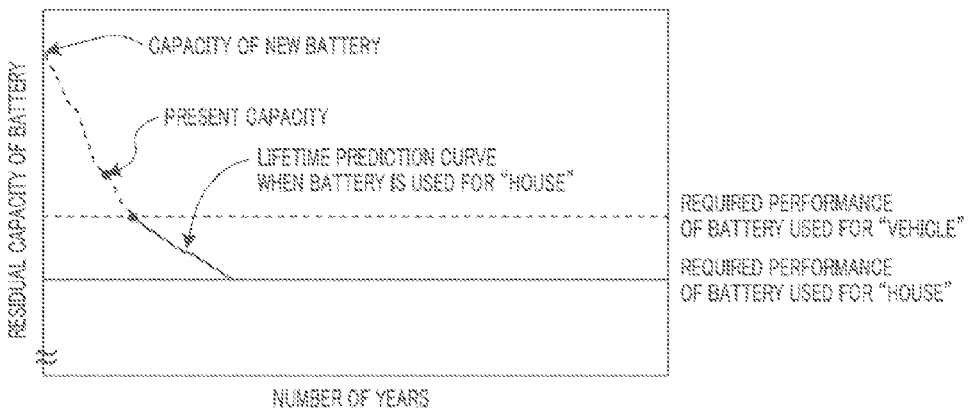
Figure 10C:
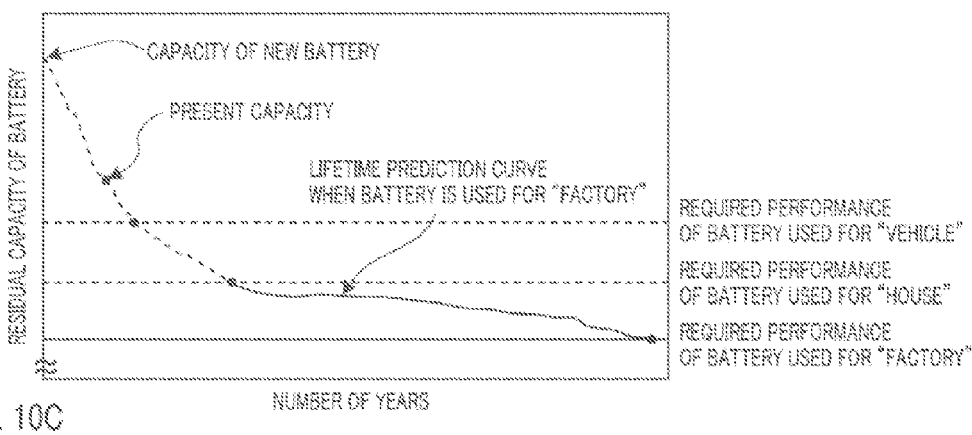
Figure 11A:
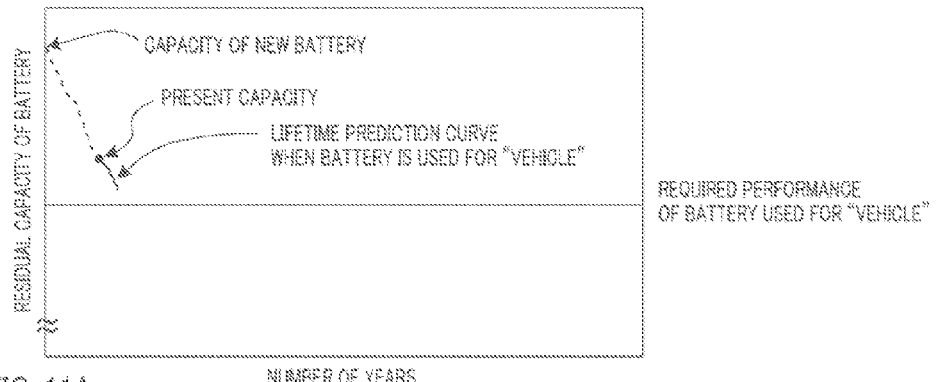
FIGS. 11A to 11C are graphs illustrating the deterioration prediction curves of the storage battery in another relocation model.
Figure 11B:
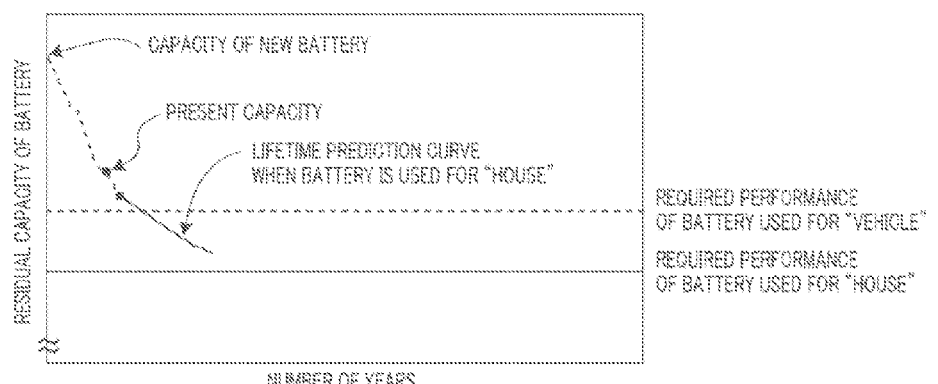
Figure 11C:
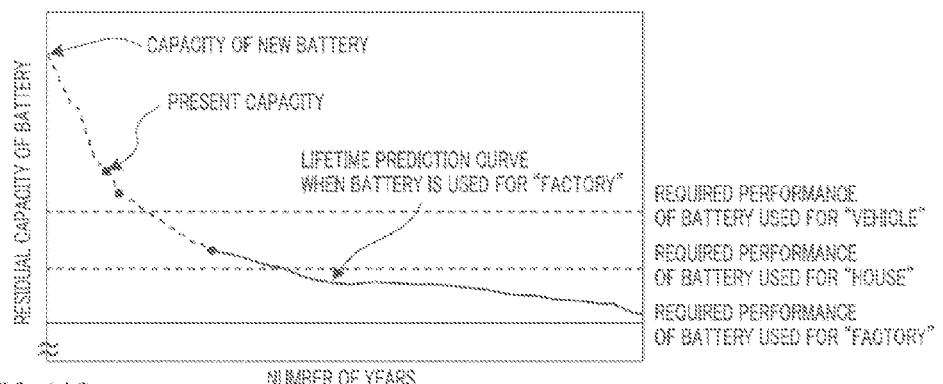

FIG. 8 is a flow chart illustrating the procedure of the storage battery deterioration prediction process. FIG. 9 is an explanatory diagram illustrating the various relocation models subject to deterioration prediction. FIGS. 10A to 10C are graphs illustrating the outline of the deterioration prediction curves of the storage battery in one relocation model. FIGS. 11A to 11C are graphs illustrating the outline of the deterioration prediction curves of the storage battery in another relocation model.

For example, at a time when an execution instruction is inputted from an operator, or at predetermined time intervals, in-use battery deterioration prediction section 12 starts this storage battery deterioration prediction process. If the process starts, in-use battery deterioration prediction section 12 first reads in-use battery information from the in-use battery information storing section in step S11.

Next, in step S12, in-use battery deterioration prediction section 12 sequentially selectively sets one relocation model for relocating a storage battery in the plurality of facilities from among the various relocation models.

As illustrated in FIGS. 9A to 9D, 9M and 9Q, the various relocation models include a plurality of relocation patterns in which a storage battery is first used for vehicle 100 having severe use conditions and is then relocated to house 200, building 300, or factory 400 in order of the gradually loosened use conditions. As illustrated in FIGS. 9B to 9D, the various relocation models also include relocation patterns involving the skip of one or more of house 200, building 300, and factory 400.

Moreover, the various relocation models also include patterns based on changing storage battery relocation time. For example, the relocation models in FIGS. 9A to 9M have patterns in which a storage battery is relocated when the storage battery performance reaches the lower limit of the required performance for the facility using the storage battery. On the other hand, the relocation model in FIG. 9Q has a pattern in which a storage battery is relocated a little earlier (for example, a storage battery is relocated when the storage battery performance reaches a higher level by a predetermined amount than the lower limit of the required performance).

Moreover, as illustrated in FIGS. 9D and 9M, the various relocation models also include patterns in which a relocation destination is set to another house 200, another building 300, or another factory 400 in the same category. Even in a facility in the same category (for example, house), a storage battery is severely utilized in some place and less severely utilized in another place, and the progression degree of deterioration is not necessarily the same. In consideration of this, the relocation model in FIG. 9M involves relocation destinations changed independently.

In the case of an enormous number of facilities, if relocation models for relocating storage batteries are prepared for all the facilities, the number of relocation models increases significantly. Therefore, in the case of an enormous number of facilities, in the same facility category, a facility model may be prepared so as to have a standard progression degree of deterioration, a plurality of facility models may be prepared so as to have progression degrees of deterioration shifted from the standard degree at a plurality of levels, and these facility models may be combined to thereby prepare relocation models.

Next, in step S13, in-use battery deterioration prediction section 12 predicts deterioration of the storage battery according to the relocation model set in step S12. For example, the graphs in FIGS. 10A to 10C illustrate the case of a relocation model in which a storage battery used in vehicle 100 is used down to the lower limit of the required performance in each facility and is sequentially relocated to house 200 and then factory 400.

In this case, in-use battery deterioration prediction section 12 predicts the deterioration prediction curve in vehicle 100 in FIG. 10A, for example, from the time transition data of the deterioration state (SOH) in the in-use battery information. Alternatively, in-use battery deterioration prediction section 12 can calculate a deterioration prediction curve from the data of the voltage log, the current log, and the temperature log in the in-use battery information, assuming that the same use situation continues.

In-use battery deterioration prediction section 12 also calculates the deterioration prediction curve in house 200 in FIG. 10B, on the basis of the in-use battery information on another storage battery used in house 200. That is, a deterioration prediction curve is calculated from the data of the time transition data of the deterioration state (SOH) or the voltage log, the current log, and the temperature log included in the in-use battery information, assuming that the storage battery is used in the same situation.

Furthermore, in-use battery deterioration prediction section 12 similarly calculates the deterioration prediction curve of factory 400 in FIG. 10C, on the basis of the in-use battery information on another storage battery used in factory 400.

Next, another example of a deterioration prediction step will be explained. The graphs of FIGS. 11A to 11C illustrate the case of a relocation model for sequentially relocating a storage battery presently used in vehicle 100 to house 200 and factory 400 in a stage involving a higher level by 10% than the lower limit of the required performance in each facility.

In this relocation model, in-use battery deterioration prediction section 12 calculates a deterioration prediction curve by setting the relocation time for a storage battery to the time when the storage battery performance reaches a higher value by a predetermined ratio than the lower limit of the required performance of each facility. In-use battery deterioration prediction section 12 also summarizes and calculates prediction of the progression degree of deterioration in each facility on the basis of the in-use battery information also in this relocation model similarly to the case of the relocation model in FIG. 10.

In-use battery deterioration prediction section 12 may also read the use-destination-information from use-destination-information storing section 23 to acquire information on the storage battery required performance in each facility.

Through such deterioration prediction, in-use battery deterioration prediction section 12 obtains the deterioration prediction curve of the storage battery for one relocation model, as illustrated in FIGS. 10A to 10C or 11A to 11C.

Next, in step S14, in-use battery deterioration prediction section 12 accumulates the prediction result data representing the deterioration prediction curve obtained in step S13, into in-use battery deterioration prediction information storing section 22.

Through a process loop of steps S12 to S15, in-use battery deterioration prediction section 12 then repeats the deterioration prediction and accumulation of the prediction result data for all the relocation patterns. Through a process loop of steps S11 to S16, in-use battery deterioration prediction section 12 also repeats the deterioration prediction and accumulation of the prediction result data for all the storage batteries.

Through such a storage battery deterioration prediction process, as illustrated in FIG. 3, in-use battery deterioration prediction information storing section 22 accumulates therein the data of the deterioration curve in the case of the relocation use in the various relocation models for each storage battery.

[Deterioration Prediction of Collected Battery]

Collected-battery deterioration prediction section 16 predicts deterioration of the plurality of storage batteries B that would occur if they are continued to be kept in the collected-battery warehouse, and stores the data of the predicted deterioration curve in collected-battery deterioration prediction information storing section 25.

This deterioration curve can be predicted and calculated from the time transition data of the deterioration state (SOH) or the data of the voltage log, the current log, and the temperature log stored in collected-battery information storing section 26, assuming that the deterioration progresses in the same situation.

Additionally, collected-battery deterioration prediction section 16 may also predict deterioration of a collected battery used by relocation, for example, to the house, the building, or the factory similarly to in-use battery deterioration prediction section 12, and may store the deterioration curve in collected-battery deterioration prediction information storing section 25.

[Relocation Determination Process]

Next, a relocation determination process performed by relocation determination section 14 will be described.

Figure 12:
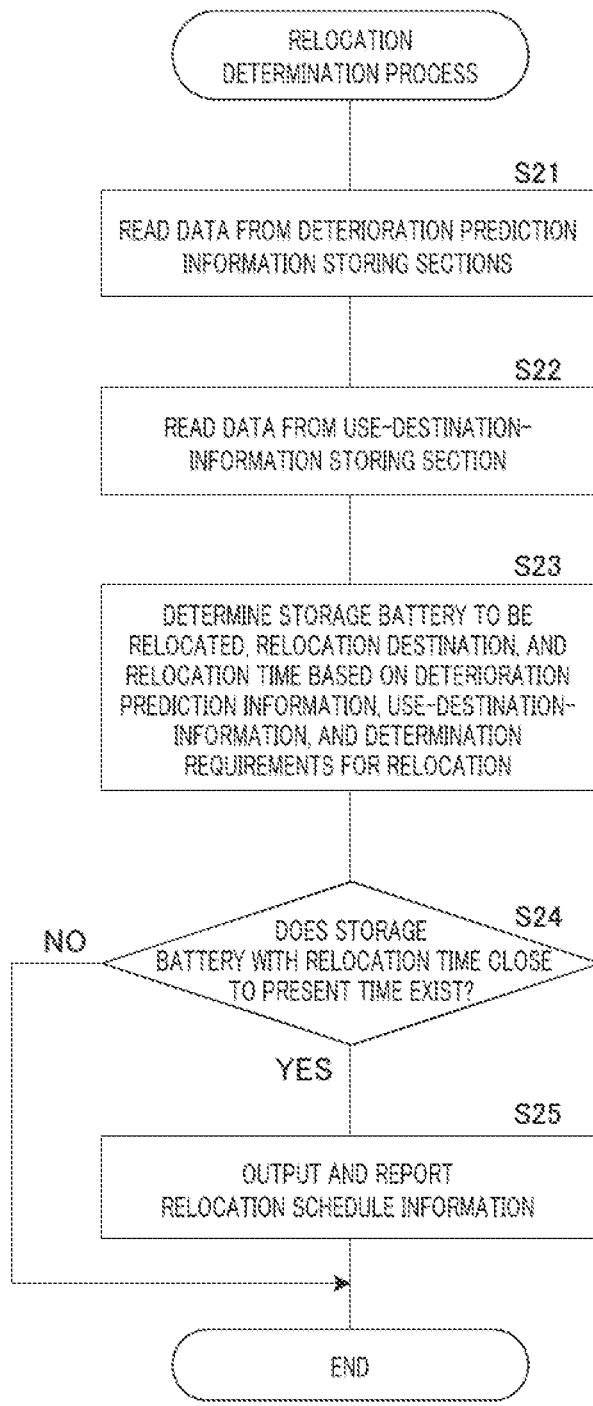
FIG. 12 is a flow chart of a relocation determination process performed in a relocation determination section.

FIG. 12 is a flow chart illustrating a procedure of the relocation determination process. FIG. 13 is a table illustrating determination requirements for relocating a storage battery.

Relocation determination section 14 starts this relocation determination process in response to an instruction from an operator or at predetermined time interval. If the process is started, relocation determination section 14 first reads, in step S21, the data of predicted deterioration curve (also referred to as "deterioration prediction information") of each storage battery from in-use battery deterioration prediction information storing section 22, unused-battery deterioration prediction information storing section 24, and collected-battery deterioration prediction information storing section 25.

Next, in step S22, relocation determination section 14 reads use-destination-information from use-destination-information storing section 23.

Then, in step S23, relocation determination section 14 determines the combination of the optimal relocation time and relocation destination (referred to as "relocation schedule") for each storage battery on the basis of the read data, by performing a calculation process (for example, optimization process) for comprehensively improving the sufficiency level of a plurality of predetermined determination requirements.

As illustrated in FIG. 13, the determination requirements for relocating storage batteries include, for example, a requirement of maintaining the contract electric power demand in each use destination, a requirement of maintaining the contract battery capacity in each use destination, and a requirement of setting relocation time in a way that makes the relocation time close to a time when the storage battery performance comes near the lower limit of the required performance in each facility. Moreover, the determination requirements include, for example, a requirement of decreasing the number of new storage batteries to be supplied, a requirement of reducing a variation in the deterioration degrees of storage batteries simultaneously used in each facility, and a requirement of decreasing the reserved quantity of collected batteries. Moreover, the determination requirements include a requirement of increasing the usage rate of the installation space for storage batteries in each facility.

The respective determination requirements are assigned with weighting factors $\lambda_1, \lambda_2, \ldots$. In step S23, relocation determination section 14 performs a calculation process so as to better satisfy a requirement having a larger weighting factor, and determines the relocation schedule for each storage battery.

Through such a relocation determination step, for example, when the storage battery of certain house 200 approaches the lower limit of the required performance, the optimal storage battery which can be relocated from vehicle 100 to this house 200 is extracted to display this information on the relocation schedule. Similarly, when the storage battery of certain factory 400 approaches the lower limit of the required performance, the optimal storage battery which can be relocated from the plurality of vehicles 100, houses 200, or buildings 300 to this factory 400 is extracted to display this information on the relocation schedule. Moreover, when abnormality or a sign of failure is found in several storage batteries in a certain facility, information representing that the several storage batteries need to be replaced is displayed on the relocation schedule.

Moreover, through the above-mentioned relocation determination step, the calculation process for comprehensively improving the sufficiency level of each determination requirement calculates a relocation schedule for storage batteries, the relocation schedule surely satisfying a requirement of maintaining the contract electric power demand in each use destination and a requirement of maintaining the contract battery capacity in each use destination. Moreover, the relocation schedule for each storage battery is calculated to set relocation time in a way that makes the relocation time as close as possible to a time when a storage battery comes near the lower limit of the required performance in each facility and so as to minimize the number of new storage batteries to be supplied. Moreover, the relocation schedule is calculated so as to minimize a variation in the deterioration degrees of storage batteries simultaneously used in each facility and so as to minimize the reserved quantity of collected batteries. Moreover, the relocation schedule is calculated so as to relocate many progressively deteriorated storage batteries to a facility having a large installation space to increase the usage rate of the large installation space. The relocation schedule is calculated according to other determination requirements that are set variously.

Next, in step S24, relocation determination section 14 distinguishes a relocation schedule involving relocation time close to the present time (for example, within one month from the present time) from among the determined relocation schedules. Then, if relocation determination section 14 finds a relocation schedule close to the present time, relocation determination section 14 outputs information on the relocation schedule to reporting section 15, in step S25. Thereby, the information on the relocation schedule is reported from reporting section 15 to an operator.

Through such a relocation determination process, the optimized relocation schedule, which can better satisfy the determination requirements for relocation, for the storage battery is determined to display information on this relocation schedule for an operator. Based on the information on this relocation schedule, an operator sets the schedule for relocation exchange for storage batteries in the plurality of vehicle 100, the plurality of house 200, the plurality of building 300, the plurality of factories 400, and collected-battery warehouse 500 in reality, and can advance a procedure of relocation of the storage batteries. That is, the operator and a worker, for example, report an exchange of a storage battery and perform exchange maintenance of a storage battery for a contractor according to the schedule for a relocation exchange.

[Variation of Relocation Use of Storage Battery]

FIGS. 14A to 16 are explanatory diagrams of an example of repacking for relocating a storage battery.

Figure 14A:
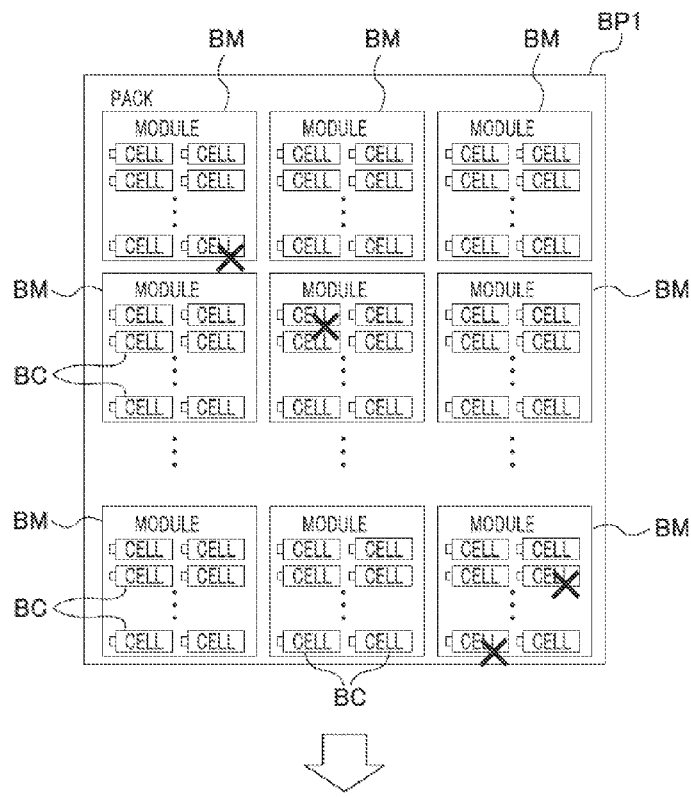
FIGS. 14A and 14B are explanatory diagrams of an example of repacking for relocating a storage battery.
Figure 14B:
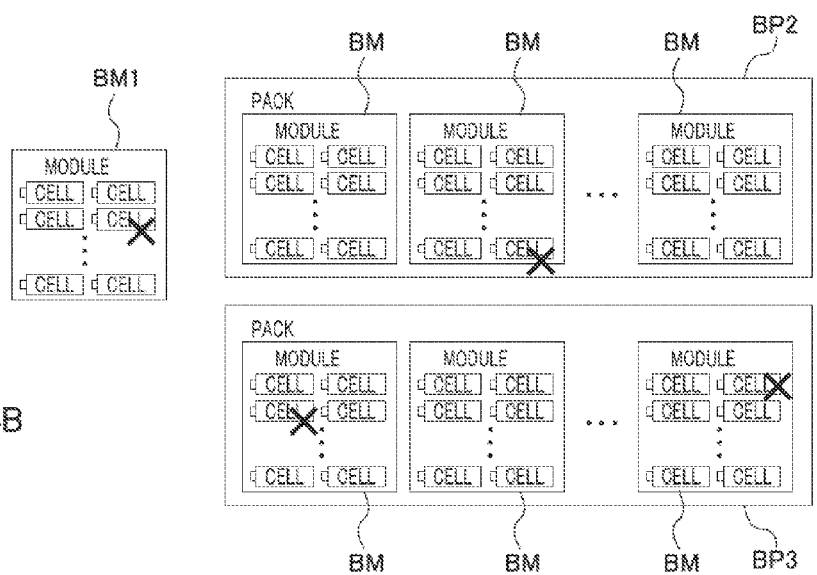

As illustrated in FIGS. 14A and 14B, instead of relocation of a storage battery, battery pack BP1, without modification, the storage battery may be relocated after repacking battery pack BP1 into other battery packs BP2 and BP3 according to conditions of a relocation destination or the battery state in battery pack BP1. Alternatively, a storage battery may be relocated in units of battery modules BM1.

Figure 15A:
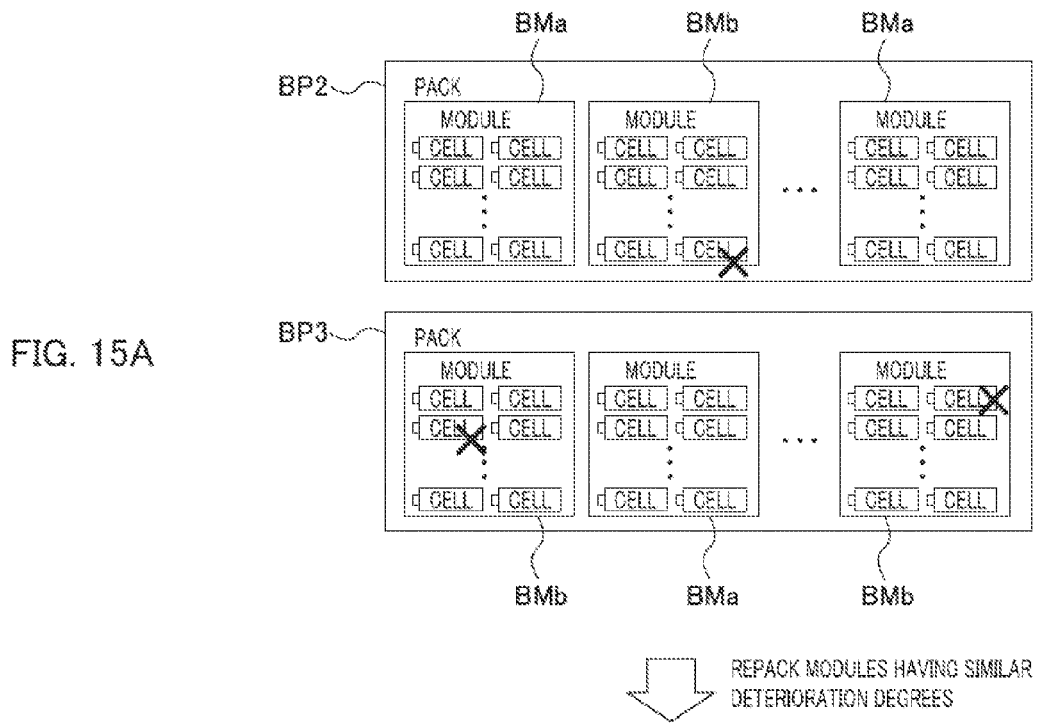
FIGS. 15A and 15B are explanatory diagrams of an example of repacking for relocating a storage battery.
Figure 15B:
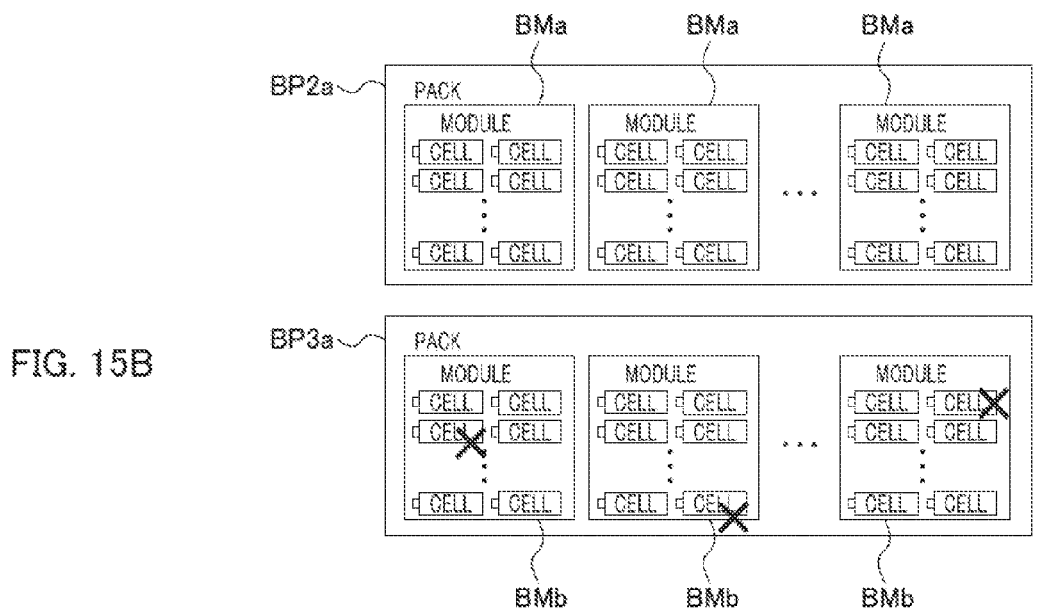

Alternatively, as illustrated in FIG. 15, a storage battery may be relocated after such repacking that the deterioration degrees of a plurality of battery modules BMa and BMb in battery packs BP2 and BP3 are uniform. Then, battery packs BP2a and BP3a repacked so as to have uniform deterioration degrees may also be relocated.

Figure 16:
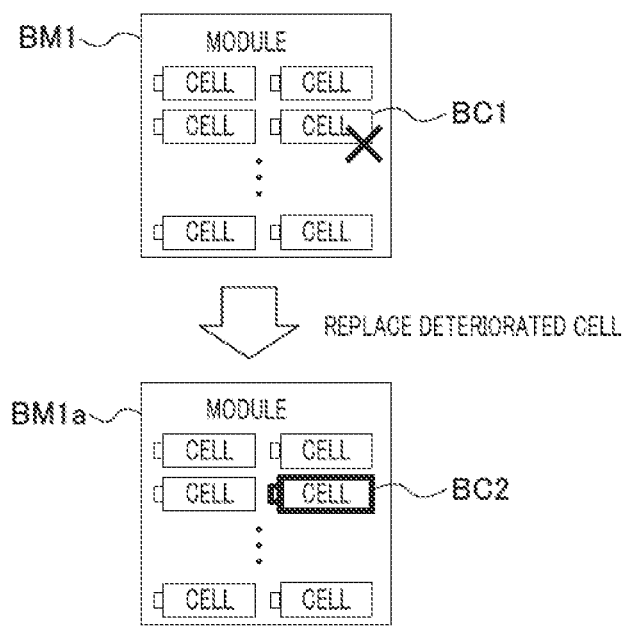
FIG. 16 is an explanatory diagram of an example of repacking for relocating a storage battery.

Alternatively, as illustrated in FIG. 16, when only one or more battery cells BC1 in battery module BM1 have deteriorated significantly, a storage battery may be relocated after replacing this battery cell BC1 with battery cell BC2 deteriorated in a similar degree to the other cells. Then, battery module BM1a partially replaced may be relocated.

In the above-described relocation determination process, relocation determination section 14 can also determine a relocation schedule in units of battery modules BM or in units of battery cells BC to thereby display information on combination for repacking battery packs and information on combination for uniforming non-uniform deterioration degrees.

Advantageous Effects of Embodiment

As described above, according to storage battery relocation assistance server 1 and the storage battery recycle system in this embodiment, the in-use battery information representing the states of the plurality of storage batteries used in the plurality of facilities is collected in storage battery relocation assistance server 1. Furthermore, in-use battery deterioration prediction section 12 in storage battery relocation assistance server 1 predicts deterioration of storage batteries in the case of relocating the storage batteries in the plurality of facilities, on the basis of these information items. Therefore, this deterioration prediction result can assist determination of the optimal relocation time and relocation destination of a storage battery.

According to storage battery relocation assistance server 1 in this embodiment, relocation determination section 14 determines the combination of the optimal relocation time and relocation destination for each storage battery, on the basis of the deterioration prediction result in the case of relocating each storage battery among the plurality of facilities and the use-destination-information. Storage battery relocation assistance server 1 then outputs information on the relocation schedule of the determination result to the exterior. Therefore, on the basis of the information on this relocation schedule, an operator or a worker can set the schedule for relocating storage batteries in reality among the plurality of facilities and can cause the plurality of storage batteries to be relocated and used in the plurality of facilities. This can contribute to a comprehensive cost reduction for the life cycle from manufacturing to recycling of a storage battery.

The embodiment of the present invention has been described thus far.

The above-described embodiment has been described in an example case where in-use battery state collection section 11 collects battery information through communication network 600. However, the battery information may also be collected after a delay of one week to several months, instead of real-time collecting of the battery information. Therefore, for example, the battery information may be accumulated in the facility during a predetermined period, and in-use battery state collection section 11 may collect this battery information through a storage medium, such as a record disk, a memory card, or a USB (Universal Serial Bus) memory. Specifically, the storage medium having battery information written in the facility may be sent to the manager of storage battery relocation assistance server 1, and the manager may read battery information from this storage medium to send the battery information to in-use battery state collection section 11.

The embodiment has been described above with an example which involves one kind of storage battery, i.e., a lithium ion secondary battery. However, storage battery relocation assistance server 1 may handle a plurality of kinds of storage batteries (for example, a lithium ion secondary battery and a nickel hydrogen secondary battery). Storage battery relocation assistance server 1 then performs a relocation schedule for relocating, to a facility using a first kind of storage battery, and using a second kind of storage battery.

The embodiment has been described using specific examples for the contents of the in-use battery information, use-destination-information, and the determination requirement for relocation. However, the in-use battery information, the use-destination-information, and the determination requirement for relocation are not limited to the contents described in the embodiment. The relocation model which is set for predicting deterioration of a storage battery can also be modified appropriately by, for example, adding a relocation model having a collection period in midstream.

The disclosure of Japanese Patent Application No. 2011-266774, filed on Dec. 6, 2011, including the specification, drawings and abstract, is incorporated herein by reference in its entirety.

INDUSTRIAL APPLICABILITY

The present invention can be utilized for the storage battery comprehensive management service for relocating and using a storage battery among the plurality of facilities.

REFERENCE SIGNS LIST

1 Storage battery relocation assistance server
11 In-use battery state collection section
12 In-use battery deterioration prediction section
13 Input section
14 Relocation determination section
15 Reporting section
16 Collected-battery deterioration prediction section
17 Collected-battery state collection section
20 Storing section
21 In-use battery information storing section
22 In-use battery deterioration prediction information storing section
23 Use-destination-information storing section
24 Unused-battery deterioration prediction information storing section
25 Collected-battery deterioration prediction information storing section
26 Collected-battery information storing section
100 Vehicle
200 House
300 Building
400 Factory
500 Collected-battery warehouse
600 Network
B Storage battery
BP Battery pack
BM Battery module
BC Battery cell

The invention claimed is:

1. A storage battery relocation assistance apparatus comprising:
a collection section that collects battery information representing a state of a plurality of storage batteries used in a plurality of facilities;
a battery information storing section that stores the battery information collected by the collection section; and
a deterioration prediction section that predicts deterioration of the plurality of storage batteries when the plurality of storage batteries are relocated and used among the plurality of facilities, based on the battery information stored in the battery information storing section.

2. The storage battery relocation assistance apparatus according to claim 1, further comprising:
a requirement information storing section that stores requirement information for a storage battery in the plurality of facilities;
a relocation determination section that determines a relocation schedule including relocation time and a relocation destination when the plurality of storage batteries are relocated and used in the plurality of facilities, based on a prediction result of the deterioration prediction section and the requirement information stored in the requirement information storing section; and
an information output section that externally outputs information on the relocation schedule determined by the relocation determination section.

3. The storage battery relocation assistance apparatus according to claim 1, wherein:
the plurality of facilities include a plurality of vehicles each of which runs with electric power from a storage battery, a plurality of residential facilities in each of which an appliance is operated with electric power from a storage battery, and a plurality of factory facilities in each of which an industrial appliance is operated with electric power from a storage battery; and
the deterioration prediction section predicts deterioration of the plurality of storage batteries according to a relocation pattern for first using each of the plurality of storage batteries in any of the plurality of vehicles and then relocating the each of the plurality of storage batteries to another facility.

4. The storage battery relocation assistance apparatus according to claim 2, wherein:
the plurality of facilities include a plurality of vehicles each of which runs with electric power from a storage battery, a plurality of residential facilities in each of which an appliance is operated with electric power from a storage battery, and a plurality of factory facilities in each of which an industrial appliance is operated with electric power from a storage battery; and
the deterioration prediction section predicts deterioration of the plurality of storage batteries according to a relocation pattern for first using each of the plurality of storage batteries in any of the plurality of vehicles and then relocating the each of the plurality of storage batteries to another facility.

5. The storage battery relocation assistance apparatus according to claim 1, wherein the plurality of storage batteries include one of or both a new storage battery to be newly supplied and a collected secondhand storage battery.

6. The storage battery relocation assistance apparatus according to claim 2, wherein the relocation determination section determines the relocation schedule by performing a calculation process for comprehensively improving requirement sufficiency levels of a plurality of determination requirements representing relocation conditions for a storage battery.

7. The storage battery relocation assistance apparatus according to claim 6, wherein the plurality of determination requirements include a requirement of setting relocation time in a way that makes the relocation time close to a time when performance of a storage battery used in each of the facilities reaches near a lower limit of performance required for the facility.

8. The storage battery relocation assistance apparatus according to claim 6, wherein the plurality of determination requirements include a requirement of relocating, before an electric power supply amount from a storage battery required for each of the facilities is no longer maintained, another storage battery to this facility for maintaining the required electric power supply amount.

9. The storage battery relocation assistance apparatus according to claim 6, wherein the plurality of determination requirements include a requirement of reducing a variation in deterioration degrees of a plurality of storage batteries used in one of the facilities.

10. The storage battery relocation assistance apparatus according to claim 6, wherein:
the requirement information includes information on an installation space for a storage battery in each of the facilities; and
the plurality of determination requirements include a requirement of increasing a usage rate of the installation space for a storage battery in each of the facilities.

11. The storage battery relocation assistance apparatus according to claim 6, wherein:
the plurality of storage batteries include a new storage battery to be newly supplied; and
the plurality of determination requirements include a requirement of reducing frequency of supplying the new storage battery in the facilities other than the vehicle.

12. The storage battery relocation assistance apparatus according to claim 2, wherein:
the deterioration prediction section predicts deterioration of each of the plurality of storage batteries when the each of the plurality of storage batteries is relocated in the plurality of relocation patterns among the plurality of facilities; and
the relocation determination section determines the relocation schedule with reference to results of deterioration prediction for relocation in the plurality of relocation patterns.

13. The storage battery relocation assistance apparatus according to claim 1, wherein
the battery information includes log information on a voltage when each of the plurality of storage batteries is charged and discharged, log information on a current when each of the plurality of storage batteries is charged and discharged, log information on each temperature of the plurality of storage batteries, log information on each state of charge of the plurality of storage batteries, log information on each deterioration state of the plurality of storage batteries, or log information on charge and discharge allowable electric power of each of the plurality of storage batteries.

14. The storage battery relocation assistance apparatus according to claim 2, wherein the requirement information includes information on supply electric power from a storage battery promised to a user of each of the facilities, information on a capacity of a storage battery promised to the user of each of the facilities, and information on an installation space for a storage battery in each of the facilities.

15. The storage battery relocation assistance apparatus according to claim 14, wherein the relocation determination section determines the relocation schedule, based on the information on the installation space with an assumption that a larger installation space allows relocation of a larger number of progressively deteriorated storage batteries.

16. The storage battery relocation assistance apparatus according to claim 2, wherein the predicting of deterioration by the deterioration prediction section and the determining of relocation by the relocation determination section are performed in units of battery packs, battery modules, or battery cells of storage batteries.

17. The storage battery relocation assistance apparatus according to claim 2, further comprising:
an input section that inputs information, wherein:
the requirement information storing section allows for addition of the requirement information on a new facility inputted through the input section; and
the relocation determination section determines the relocation schedule when the plurality of storage batteries are relocated and used among the plurality of facilities including the new facility.

18. The storage battery relocation assistance apparatus according to claim 1, wherein the collection section collects the battery information through one of or both a communication network and a storage medium.

19. A storage battery relocation assistance apparatus comprising:
a collection section that collects battery information representing a state of a plurality of storage batteries used in a plurality of facilities;
a battery information storing section that stores the battery information collected by the collection section;
a requirement information storing section that stores requirement information for a storage battery in the plurality of facilities; and
a relocation determination section that determines a relocation schedule including relocation time and a relocation destination when the plurality of storage batteries are relocated and used in the plurality of facilities, based on the battery information stored in the battery information storing section and the requirement information stored in the requirement information storing section.

20. The storage battery relocation assistance apparatus according to claim 19, further comprising an information output section that externally outputs information on the relocation schedule determined by the relocation determination section.

* * * * *